United States Patent
Savoj et al.

(10) Patent No.: US 9,720,033 B2
(45) Date of Patent: Aug. 1, 2017

(54) ON-CHIP PARAMETER MEASUREMENT

(71) Applicant: Apple Inc., Cupertino, CA (US)

(72) Inventors: Jafar Savoj, Sunnyvale, CA (US); Brian S. Leibowitz, San Francisco, CA (US); Emerson S. Fang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/868,954

(22) Filed: Sep. 29, 2015

(65) Prior Publication Data

US 2017/0089975 A1    Mar. 30, 2017

(51) Int. Cl.
*G01R 31/28* (2006.01)
*G01R 35/00* (2006.01)

(52) U.S. Cl.
CPC ..... *G01R 31/2874* (2013.01); *G01R 31/2884* (2013.01); *G01R 35/005* (2013.01)

(58) Field of Classification Search
CPC .................................................. G01K 7/01
See application file for complete search history.

(56) References Cited

U.S. PATENT DOCUMENTS

| | | | |
|---|---|---|---|
| 6,160,755 A | 12/2000 | Norman et al. | |
| 6,853,259 B2 | 2/2005 | Norman et al. | |
| 7,831,873 B1 | 11/2010 | Trimberger et al. | |
| 2005/0281112 A1* | 12/2005 | Ito | G11C 11/406 365/222 |
| 2006/0238267 A1 | 10/2006 | Bienek | |
| 2007/0046369 A1 | 3/2007 | Schober et al. | |
| 2007/0160113 A1* | 7/2007 | Kim | G01K 7/01 374/178 |
| 2008/0155282 A1* | 6/2008 | Gammie | G06F 1/26 713/300 |
| 2008/0288197 A1* | 11/2008 | Singh | G01R 31/2874 702/79 |

(Continued)

OTHER PUBLICATIONS

Pooirier et al., Power and Temperature Control on a 90nm Itanium®-Family Processor, Intel, Fort Collins, CO, ISSCC 2005 / Feb. 8, 2005 / Salon 8 / 4:45 PM / Session 16 / Clock Distribution and Power Management / 16.7, 304 • Digest of Technical Papers, 2005 IEEE International Solid-State Circuits Conference 0-7803-8904-2/05 © 2005 IEEE, pp. 304-305.

(Continued)

*Primary Examiner* — Clayton E Laballe
*Assistant Examiner* — Noam Reisner
(74) *Attorney, Agent, or Firm* — Meyertons, Hood, Kivlin, Kowert & Goetzel, P.C.; Erik A. Heter

(57) ABSTRACT

An apparatus and method for performing on-chip parameter measurement is disclosed. In one embodiment, an IC includes a number of functional circuit blocks each having one or more sensors for measuring parameters such as voltage and temperature. Each of the functional blocks includes circuitry coupled to receive power from a local supply voltage node. Similarly, the circuitry in each of the sensors is also coupled to receive power from the corresponding local supply voltage node. Each of the sensors may be calibrated to compensate for process, voltage, and temperature variations. Various methods based on characterization of the sensors may be used to perform the calibrations.

40 Claims, 10 Drawing Sheets

(56) References Cited

U.S. PATENT DOCUMENTS

| | | | |
|---|---|---|---|
| 2010/0231286 A1* | 9/2010 | Kuusilinna | G01K 7/425 |
| | | | 327/512 |
| 2012/0110352 A1* | 5/2012 | Branover | G06F 1/206 |
| | | | 713/300 |
| 2012/0242392 A1* | 9/2012 | Kim | H03K 19/0016 |
| | | | 327/378 |
| 2013/0110437 A1* | 5/2013 | Singh | G01K 15/00 |
| | | | 702/85 |
| 2013/0217598 A1* | 8/2013 | Ludwig | G01N 33/54373 |
| | | | 506/16 |
| 2014/0159801 A1 | 6/2014 | Flores | |
| 2015/0052091 A1* | 2/2015 | Jamali | G06K 9/00496 |
| | | | 706/12 |

OTHER PUBLICATIONS

International Search Report and Written Opinion in application No. PCT/US2016/042975 mailed Oct. 7, 2016.

* cited by examiner

ON-CHIP PARAMETER MEASUREMENT

BACKGROUND

Technical Field

This disclosure is directed to integrated circuits, and more particularly, to monitoring parameters such as temperature and voltage during the operation of an integrated circuit.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage droops) and adjust the performance based on received measurements. For example, a control subsystem may reduce a clock frequency, supply voltage, or both, responsive to a temperature reading that exceeds a predefined threshold. This may help maintain operation of the IC within specified thermal limits. Such control systems may also boost the performance of certain functional circuits when measured metrics are well within limits.

IC subsystems used to control performance based on system metrics typically include one or more sensors and at least one control system. Due to factors such as process, voltage, and temperature variations, at least the sensors of such a subsystem may be coupled to receive power from a supply different from that used to power functional circuitry in the IC. For example, some ICs use an analog power supply that is separate from those supplies used to provide power to functional circuitry. This may provide some degree of isolation of the sensors from variations induced into the supplies that provide power to functional circuitry on the IC.

SUMMARY

An apparatus and method for performing on-chip parameter measurement is disclosed. In one embodiment, an IC includes a number of functional circuit blocks each having one or more sensors for measuring parameters such as voltage and temperature. Each of the functional blocks includes circuitry coupled to receive power from a local supply voltage node. Similarly, the circuitry in each of the sensors is also coupled to receive power from the corresponding local supply voltage node. Each of the sensors may be calibrated to compensate for process, voltage, and temperature variations. Various methods based on characterization of the sensors may be used to perform the calibrations.

In one embodiment, a method comprises sensors implemented in various functional circuit blocks of an IC. The sensors are coupled to receive the same local supply voltage as the circuitry implemented in its corresponding functional circuit block. The sensors may initially be calibrated on automated test equipment (ATE) at known voltages and temperatures. Subsequent calibrations may be performed during operation of the IC, e.g., during startup of a system in which the IC is implemented.

In various embodiments, the sensors may be implemented using ring oscillators. In one embodiment, each sensor may include two separate ring oscillators having different characteristics. Frequencies may be obtained from both ring oscillators, and voltage and temperature may be solved for based thereon. In another embodiment, a single ring oscillator may be implemented with specially configured inverters capable of receiving variable input and bias voltages. Voltage and temperature may be determined using multiple sensing technique. Various mathematical techniques, including piecewise linear fitting, a recursive least squares algorithm, and various surface fitting techniques may be used in calibrating and characterizing the ring oscillators.

BRIEF DESCRIPTION OF THE DRAWINGS

The following detailed description makes reference to the accompanying drawings, which are now briefly described.

Figure 1:
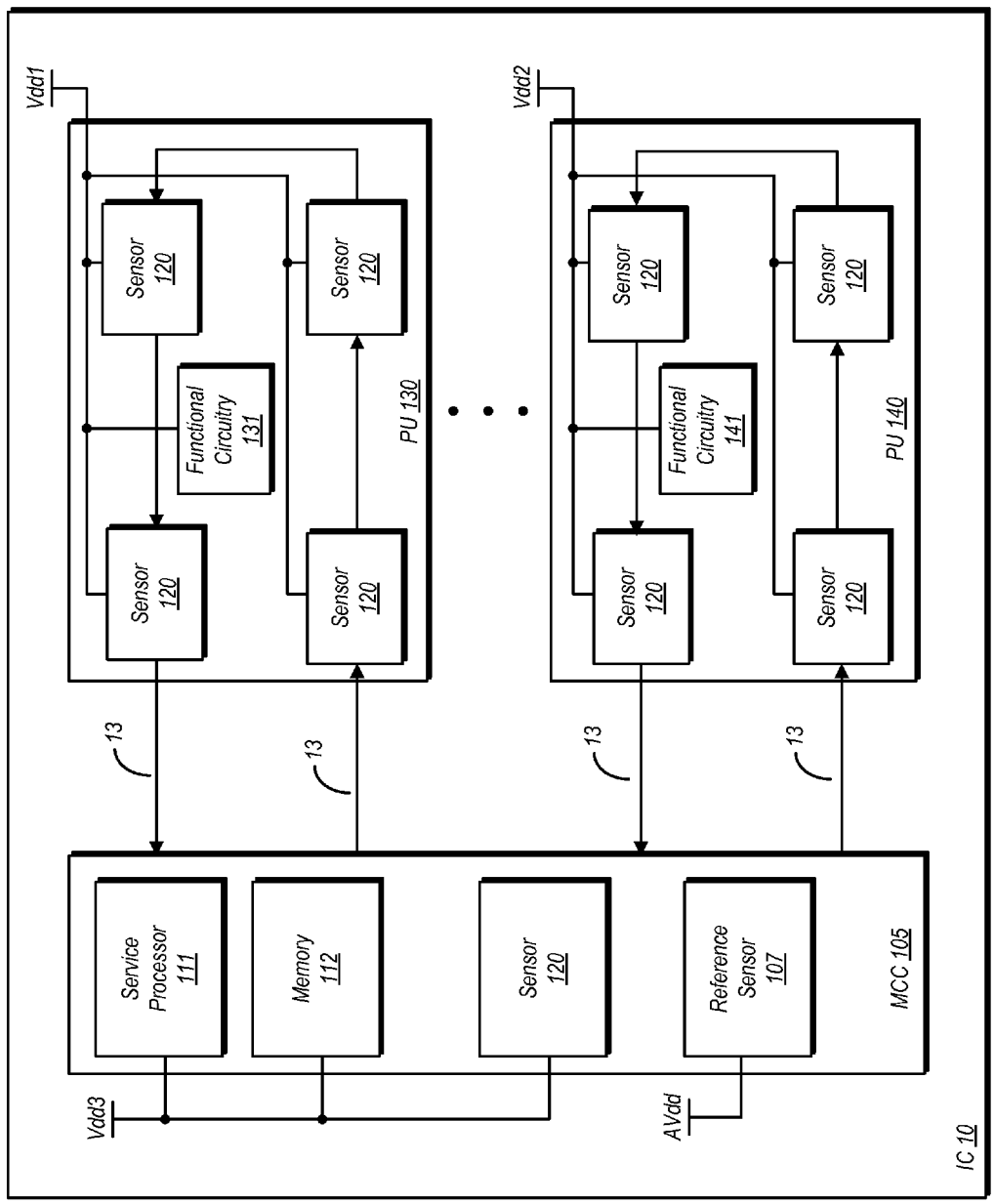
FIG. 1 is a block diagram of one embodiment of an IC.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of one embodiment of an IC is shown. In the embodiment shown, IC 10 includes two functional circuit blocks, processing unit (PU) 130, and PU 140. In various embodiments, other functional circuit blocks may be included, including additional instances of PU 130. PU 130 and PU 140 are thus shown here as exemplary functional circuit blocks, but are not intended to limit the scope of this disclosure. Each of PU 130 and 140 may be a general purpose processor core, a graphics processing unit, a digital signal processing unit, or virtually any other kind of functional unit configured to perform a processing function. The scope of this disclosure may apply to any of these types of functional circuit blocks, as well as other not explicitly mentioned herein. The number of functional circuit blocks shown here is exemplary as well, as the disclosure is not limited to any particular number.

PU 130 in the embodiment shown is a general purpose processor core configured to execute the instructions of an instruction set and perform general purpose processing operations. Functional circuitry 131 of PU 130 may thus include various types of circuitry such as execution units of various types (integer, floating point, etc.), register files, schedulers, instruction fetch units, various levels of cache memory, and other circuitry that may be implemented in a processor core. PU 130, and all circuitry therein, is coupled to receive supply voltage Vdd1 in this embodiment. It is noted however that multiple power domains, and thus multiple supply voltages, may be implemented within various embodiments of PU 130. Furthermore, supply voltages provided to PU 130 may be variable under the control of power management circuitry (not shown). The power management circuitry adjusts the voltages for various reasons, such as controlling performance levels, thermal output, and power consumption.

GPU 140 in the illustrated embodiment includes functional circuitry 141, which may implement various types of graphics processing circuitry. This may include graphics processing cores, various types of memory and registers, and so on. GPU 140 in the embodiment shown is coupled to receive a second supply voltage, Vdd2 that is separate from Vdd1 as received by PU 130.

Both PU 130 and PU 140 include a number of sensors 120. The particular number of sensors shown here is exemplary, and in actual embodiments may be greater, lesser, or equal. The sensors 120 may be configured for sensing one or more performance metrics, or parameters. In this particular embodiment, the sensors are configured to sense voltage and temperature values. The sensed voltage and temperature values may in turn be used to determine whether or not circuitry implemented therein is operating within limits and/or is capable of higher performance.

Each of the sensors 120 in the embodiment shown is coupled to the same voltage supply as the functional circuitry in its respective one of the functional circuit blocks. That is, each sensor 120 in PU 130 is coupled to receive a supply voltage Vdd1, while each sensor in GPU 140 is coupled to receive Vdd2. In prior art embodiments, such sensors are typically coupled to receive power from a supply separate from that of the functional circuitry near which they are implemented. This may limit their placement within an IC/functional circuit block due to the need to route connections for another voltage supply. Furthermore, the sensors in prior art embodiments may typically be larger than those used in the embodiments discussed herein, which may further limit their number and placement. In contrast, the sensors 120 implemented herein may be simplified sensors. Accordingly, sensors 120 may be smaller than prior art sensors. This in turn may allow more sensors to be place on an IC. Furthermore, the sensors may be placed in smaller areas, increasing the versatility of their implementation. In one embodiment, sensors 120 may be implemented using one or more ring oscillators. However, since the frequency produced by a ring oscillator may show a significant dependence on process, voltage, and temperature variations, the ring oscillators may be calibrated such that these dependencies do not adversely affect their accuracy. Various calibration and operation methodologies are discussed in further detail below. It is noted that an initial calibration (and characterizations) for each sensor may be performed during a test using automated test equipment (ATE) at known voltages and temperatures. Subsequent calibrations may be performed during startup and/or operation of the system in which IC 10 is implemented.

IC 10 in the embodiment shown includes metrology control circuitry (MCC) 105. MCC 105 may perform various operations involved with operation of the sensors 120 in the various functional circuit blocks of IC 10. In the embodiment shown, MCC 105 is coupled to each of the sensors 120 via a metrology bus 13. During operation of IC 10, each of the sensors 120 may perform readings of, e.g., a frequency of their respective ring oscillator(s), convert the frequency reading into a digital format, and transmit that information to MCC 105. In this embodiment, MCC 105 is a serial bus, and information may be shifted on the bus in operation that is similar to that of a scan chain. However, embodiments utilizing different mechanisms for communications with the sensors are possible and contemplated.

MCC 105 may receive the frequency information from each of the sensors via their correspondingly coupled instances of metrology bus 13. Using the frequency information, MCC 105 may determine a voltage and temperature sensed by each of sensors 120. In the embodiment shown, MCC 105 includes a service processor 111 and a memory 112. Service processor 111 may execute instructions of a software routine to solve for voltage and temperature values based on frequency information received from each of the sensors 120. Embodiments in which dedicated circuitry performs these task in lieu of the execution of software instructions are also possible and contemplated. Memory 112 may be used by service processor to store various information, including the frequency information received from the sensors, the determined voltage and temperature information, and intermediate information generated during the performance of calculations. Memory 112 may also store information characterizing the sensors and the circuitry therein (e.g., the ring oscillators). Memory 112 may be implemented using volatile memory, non-volatile memory, or a combination thereof.

MCC 105 also includes an instance of a sensor 120, as well as a reference sensor 107. Sensor 120 of MCC 105 is coupled to receive supply voltage Vdd3, (as are service processor 111 and memory 112). Furthermore, sensor 120 may be configured in accordance with the other instances of sensor 120 implemented on IC 10. Reference sensor 107 may receive its supply voltage from an analog voltage supply, AVdd. Reference sensor 107 in the embodiment shown may be a high accuracy sensor that is less susceptible to process, voltage, and temperature variations. Temperature readings from reference sensor 107 may be used as a reference during calibrations, or may be used to determine when recalibrations may be necessary.

Figure 2:
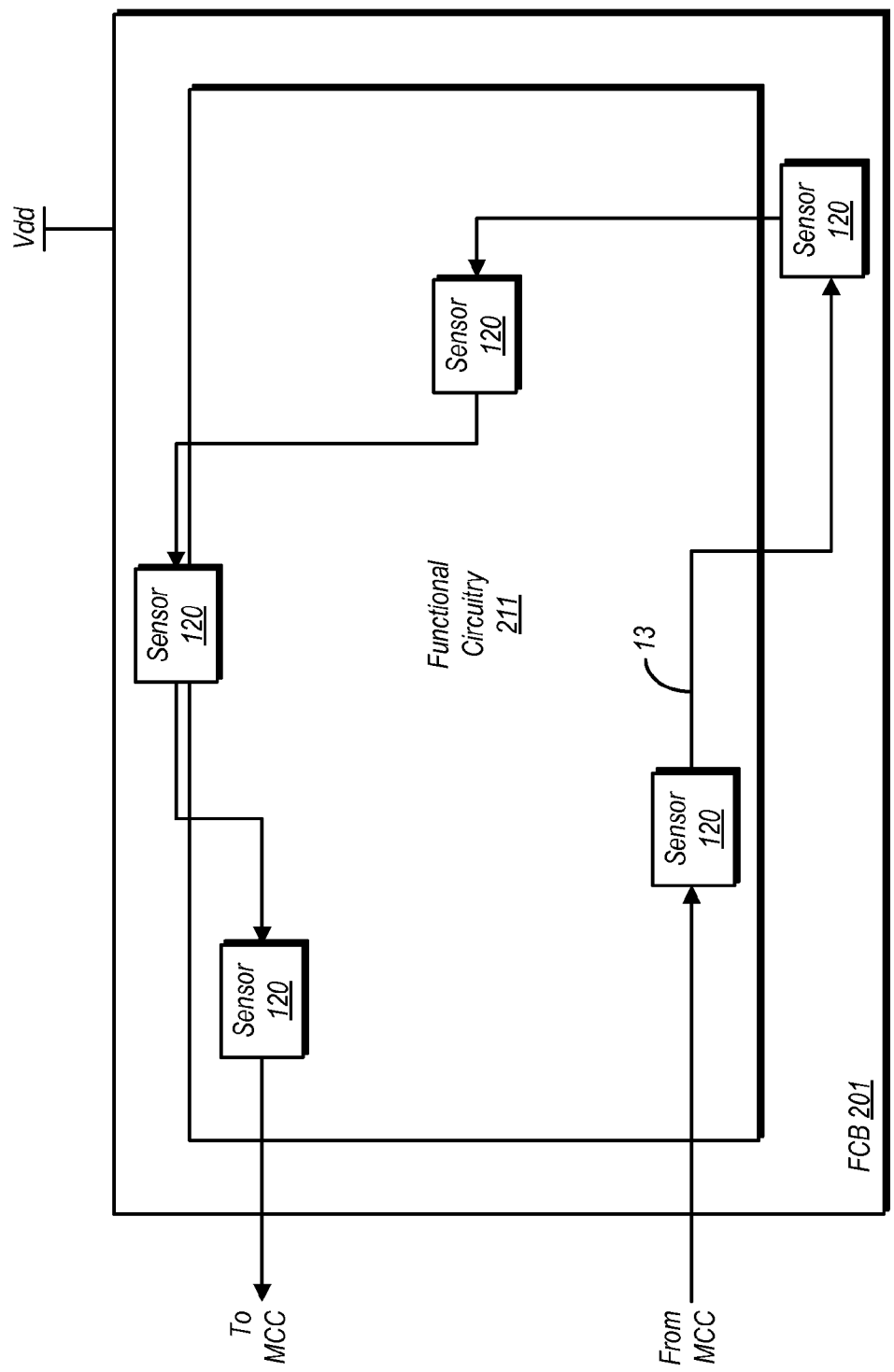
FIG. 2 is a block diagram of one embodiment of a functional circuit block having a number of sensors.

FIG. 2 is a block diagram of one embodiment of a functional circuit block having a number of sensors 120. In the embodiment shown, functional circuit block (FCB) 211 may be virtually any type of functional circuitry implemented on an IC. Included in functional circuitry 211 may be digital circuits, analog circuits, and mixed signal circuits. Sensors 120 of FCB 211 are implemented in various places in and around functional circuitry 211. Due to their relatively small footprint, at least some sensors 120 may be implemented within the area otherwise occupied by functional circuit 211, while others may be implemented near or partially within. The sensors 120 in this embodiment are coupled in a series configuration by metrology bus 13, through which data (e.g., frequency data for ring oscillators) may be shifted. Each of the sensors 120 in the embodiment shown is coupled to receive the same supply voltage, Vdd, as received by the functional circuitry 211.

Figure 3:
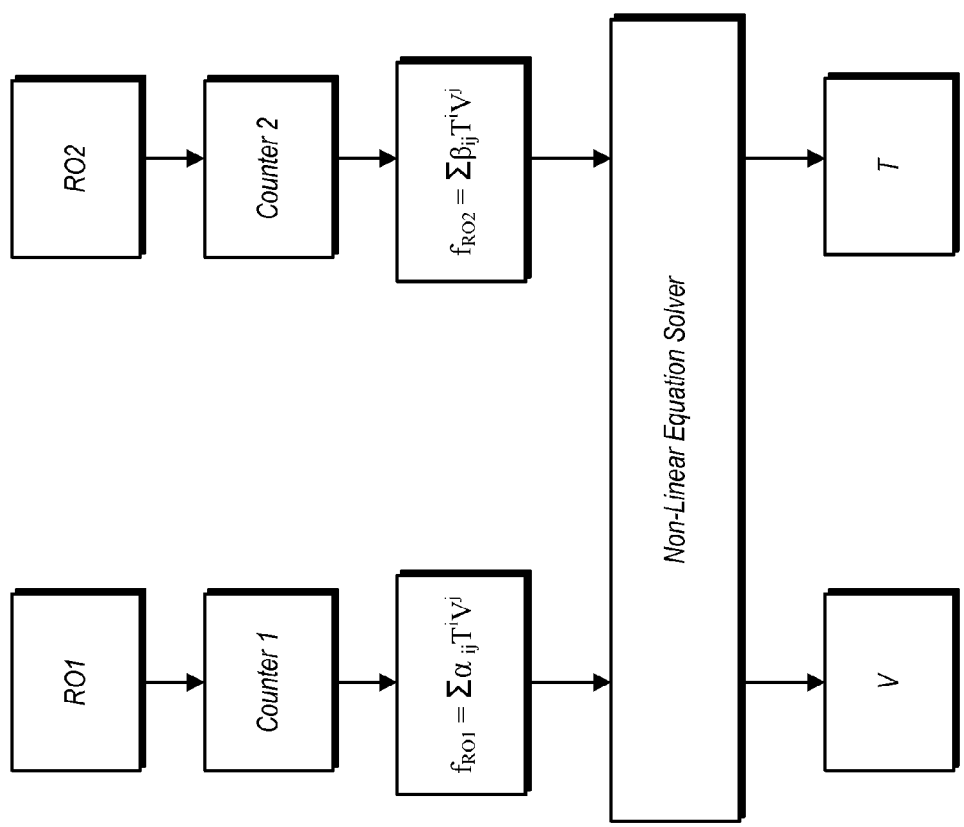
FIG. 3 is a block diagram illustrating an operational concept for an embodiment of a sensor employing two ring oscillators.

FIG. 3 is a block diagram illustrating an operational concept for an embodiment of a sensor employing two ring oscillators. In some embodiment, each sensor included two ring oscillators that are designed to have characteristics different from one another. The two ring oscillators may be implemented in close proximity to one another, and thus may operate under substantially the same voltage and temperature conditions. However, since their characteristics are different from one another, the two ring oscillators may operate at different frequencies under the same voltage and temperature conditions. This principle may enable the determination of voltage and temperature at the sensor using frequency readings from each of the ring oscillators.

In the illustrated example, two ring oscillators, RO1 and RO2 are coupled to Counter 1 and Counter 2, respectively. In taking a reading, each ring oscillator may be allowed to toggle its respectively coupled counter for a predetermined amount of time. After the predetermined time has elapsed, the counters may be frozen and their count values provided to indicate frequency.

Each of the ring oscillators may be characterized by a polynomial. More particularly, the frequency output by each ring oscillator may be characterized by a nonlinear function of voltage and temperature in a form given as shown in Equation 1:

$$f_{RO} = \Sigma \alpha_{ij} T^i V^j \quad (1)$$

Thus, the frequency of RO1 may be characterized as:

$$f_{RO1} = \Sigma \alpha_{ij} T^i V^j \quad (2),$$

while the frequency of RO2 may be characterized as:

$$f_{RO2} = \Sigma \beta_{ij} T^i V^j \quad (3).$$

The 'f' terms in the above equations may represent frequency, or alternatively, may represent a ratio of a product of the oscillating frequency and the number of phases to a reference frequency. The determination of the number of terms in this expression corresponding to a given ring oscillator is dependent on its characteristics. In general, a higher number of nonlinear terms increases the accuracy of representing the ring oscillator frequency with polynomials.

The output frequencies (or the product mentioned above) may be provided to a non-linear equation solver. Using the polynomials characterizing the ring oscillators, the simultaneous equations may be solved for both voltage and temperature as detected by the sensor. In one embodiment, the non-linear equation solver may be implemented using the service processor 111 (of FIG. 1) and software instruction executed thereby. More generally, the non-linear equation solver may be implemented using hardware, software, firmware, and any combination thereof. Moreover, it is possible and contemplated in some embodiments that the solving of the non-linear equations may be performed locally in the corresponding functional circuit blocks.

The coefficients in the equations above may be calculated based on actual ring oscillator frequencies for a given set of voltage and temperature values. Consider a model of a ring oscillator in which the frequency is defined using a 9-term function a set of 24 data points (voltage, temperature, and output frequency) used to calculate the ring oscillator characteristics. If a higher number of data points is used to determine coefficients, the resulting function may better characterize the corresponding ring oscillator. This technique may be referred to as surface fitting of the ring oscillator characteristic, and may use numerical techniques to map a large set of data points to a polynomial.

As an example, consider a frequency of a ring oscillator as being defined by the following expression:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0 \quad (4)$$

If measurements of ring oscillator frequency occur at $\{(f_0, V_0, T_0), (f_1, V_1, T_1), \ldots, (f_{23}, V_{23}, T_{23})\}$, then the following matrices can be formed:

$$F = [f_0 f_1 \ldots f_{23}] \quad (5)$$

$$A = [\alpha_{22} \alpha_{21} \alpha_{20} \alpha_{12} \alpha_{11} \alpha_{10} \alpha_{02} \alpha_{01} \alpha_{00}] \quad (6)$$

$$X = [X_0 X_1 \ldots X_{23}],$$

in which $X_j =$
$$[T_j^2 V_j^2 T_j^2 V_j^1 T_j^2 V_j^0 T_j^1 V_j^2 T_j^1 V_j^1 T_j^1 V_j^0 T_j^0 V_j^2 T_j^0 V_j^1 T_j^0 V_j^0]^T \quad (7).$$

Accordingly, the frequency F can be defined as F=AX (8). The term A can be solved for using Least Squares Estimation, computing all the coefficients in the original surface fit.

This concept can be expanded to two ring oscillators that have a different set of characteristics by characterizing each as described above. Accordingly, two ring oscillators placed in close proximity to one another, receiving the same supply voltage, and operating at substantially the same local temperature, can be characterized in two expressions as follows:

$$\begin{cases} f_{RO1} = \Sigma_{i,j} \alpha_{ij} T^i V^j \\ f_{RO2} = \Sigma_{i,j} \beta_{ij} T^i V^j \end{cases} \quad (9)$$

The above assumes that the two ring oscillators are characterized with polynomials having equal lengths, although this is not necessarily required for all instances.

The complexity of solving the simultaneous equations above may be reduced using a piecewise linear (PWL) technique. Using this technique, a two-dimensional nonlinear surface for the output frequency of a ring oscillator can be described using a set of PWL functions. The surface of operation over an entire voltage and temperature can be split into multiple triangular regions over each of which the characteristics of a corresponding can be described using a linear function of voltage and temperature. Thus, the overall surface may be broken into an integer number n of PWL regions, described as follows:

$$f = \begin{cases} a_{T1}T + a_{V1}V + a_{C1} & \text{for region 1} \\ a_{T2}T + a_{V2}V + a_{C2} & \text{for region 2} \\ \vdots \\ a_{Tn}T + a_{Vn}V + a_{Cn} & \text{for region } n \end{cases} \quad (10)$$

The coefficients for each of the PWL functions can be determined using the output frequencies at the three vertices of the triangle describing any given area. For example, for PWL function describing a triangle extending between temperatures T1 and T2 on a first axis and a voltages V1 and V2 on a second axis, with the frequencies measured at $(T_1, V_1)$, $(T_1, V_2)$, and $(T_2, V_1)$ respectively given by $f_1$, $f_2$, and $f_3$ and the index for the PWL is given as i, the following set of equations can be solved in order to compute the coefficients for the corresponding PWL function in that area:

$$\begin{cases} f_1 = a_{Ti}T_1 + a_{Vi}V_1 + a_{Ci} \\ f_2 = a_{Ti}T_1 + a_{Vi}V_2 + a_{Ci} \\ f_2 = a_{Ti}T_2 + a_{Vi}V_1 + a_{Ci} \end{cases} \quad (11)$$

This can be repeated for every region to determine its PWL characteristic, and thus to determine the surface of operation for the ring oscillator.

Once both ring oscillators have been characterized with a set of PWL function, solving the set of nonlinear equations is reduced to solving a set of PWL equations. The equations to be solved for each PWL computation may be generally described as follows:

$$\begin{cases} f_{RO1} = a_{Ti}T + a_{Vi}V + a_{Ci} \\ f_{RO2} = a_{Ti}T + a_{Vi}V + a_{Ci} \end{cases} \quad (12)$$

Solving these two equations for temperature, T, and voltage, V, results in the following:

$$\begin{cases} T = \dfrac{(f_{RO_1} - a_{Ci})b_{Vi} - (f_{RO_2} - b_{Ci})a_{Vi}}{a_{Ti}b_{Vi} - b_{Ti}a_{Vi}} = \dfrac{f_{RO1}\left(\dfrac{b_{Vi}}{a_{Ti}b_{Vi} - b_{Ti}a_{Vi}}\right) +}{f_{RO2}\left(\dfrac{-a_{Vi}}{a_{Ti}b_{Vi} - b_{Ti}a_{Vi}}\right) + \left(\dfrac{a_{Vi}b_{Ci} - b_{Vi}a_{Ci}}{a_{Ti}b_{Vi} - b_{Ti}a_{Vi}}\right)} \\ V = -\dfrac{(f_{RO_1} - a_{Ci})b_{Ti} - (f_{RO_2} - b_{Ci})a_{Ti}}{a_{Ti}b_{Vi} - b_{Ti}a_{Vi}} = \dfrac{f_{RO1}\left(\dfrac{-b_{Ti}}{a_{Ti}b_{Vi} - b_{Ti}a_{Vi}}\right) +}{f_{RO2}\left(\dfrac{a_{Ti}}{a_{Ti}b_{Vi} - b_{Ti}a_{Vi}}\right) + \left(-\dfrac{a_{Ti}b_{Ci} - b_{Ti}a_{Ci}}{a_{Ti}b_{Vi} - b_{Ti}a_{Vi}}\right)} \end{cases} \quad (13), (14)$$

As previously noted, the calculations discussed herein may be performed in MCC 105, and particularly in service processor 111. This may allow each sensor 120 to be implemented in a small area and limit its power consumption, since it need not perform any conversion of frequency to voltage and/or temperature. More generally, the features used for frequency measurement may be implemented within each sensor 120, while those features used for PWL computation, calibration against process variation, again, and accuracy may be implemented within MCC 105.

A surface fit of each ring oscillator (and thus its respective PWL representation) may change over each process corner and may also be subject to local on-die variations. Moreover, the accuracy of a given ring oscillator may be reduced due to effects such as aging. Accordingly, a calibration scheme used for such ring oscillators may update the characteristics of each. These characteristics may be updated based on a limited set of accurate measurements from each ring oscillator. If an original (but not accurate) model for a given ring oscillator is $$f_{RO\_precal} = \Sigma_{i,j}\alpha_{ij}T^i V^j \quad (15),$$

a set of actual measurements may be performed to update the coefficients such that a more accurate model of the ring oscillator is as follows:

$$f_{RO\_postcal} = \Sigma_{i,j}\alpha^*_{ij}T^i V^j \quad (16).$$

This calibration factors in both the original model and a set of calibration points. As the number of points increases, the accuracy increases correspondingly. Conversely, the efficiency of a calibration algorithm may be determined by the accuracy of the post-calibration model based on a smallest number of data points.

In one embodiment, a calibration algorithm in accordance with the disclosure includes updating the coefficients using a scaled value of the error signal at any calibration point. For any of the calibration points, the error signal (e) may be defined as the difference between the actual measurement and the value predicted by the model. That means $\forall k \in \{1, 2, \ldots, m\}$:

$$e_k = f_k - \Sigma_{i,j}\alpha_{ij}T_k^i V_k^j \quad (17).$$

If the coefficients in the original model ($\alpha_{ij}$) are consolidated in a vector given as $A_0$, a recursive approach may be utilized in which the vector is updated for every single calibration point:

$$A_k = A_{k-1} + e_k G \quad (18).$$

In one embodiment, the G vector may be determined using the Recursive Least Squares (RLS) technique. This may in turn result in a relatively fast convergence to final desired values based on a limited set of calibration data. In using the RLS technique, the G vector is recursively updated during each step. The RLS technique may utilize an alternate characterization of a ring oscillator as follows:

$$f_{RO_{precal}} = A_0 U^T \quad (19),$$

wherein U is a vector of the (i+1)(j+1) terms, i.e.:

$$U = [T^i V^j T^{i-1} V^j \ldots T^0 V^0] \quad (20).$$

From this, a diagonal matrix may be formed:

$$P_0 = \begin{bmatrix} \text{var}(U(1))^{-1} & 0 & \cdots & 0 \\ 0 & \text{var}(U(2))^{-1} & & \vdots \\ \vdots & & \ddots & \vdots \\ 0 & & \cdots & dc \end{bmatrix}. \quad (21)$$

For any calibration point, the following set of computations may be performed:

$$\begin{cases} r_k = \lambda + UP_{k-1}U^T \\ G_k = \dfrac{1}{r_k} P_{k-1} U^T \\ A_k = A_{k-1} + e_k G_k \\ P_k = \dfrac{1}{\lambda} P_{k-1} - \dfrac{1}{\lambda} G_k U P_{k-1} \end{cases}, \quad (22)$$

wherein $\lambda$ is a forgetting factor, and e is the error.

Accordingly, using a recursive least squares algorithm, such as that described above, the coefficients for a polynomial characterizing a ring oscillator may be updated during a calibration procedure. Such calibrations may be performed at various times, such as on a system startup, at selected times during the life of the system/IC, responsive to large variations in the reference sensor 107 and the sensor 120 in MCC 105, and so forth. As such, voltage and temperature, based on ring oscillator frequencies, may be determined with a reasonable level of accuracy over the life of the system, while enabling the use of simple sensors having a small area footprint.

Figure 4:
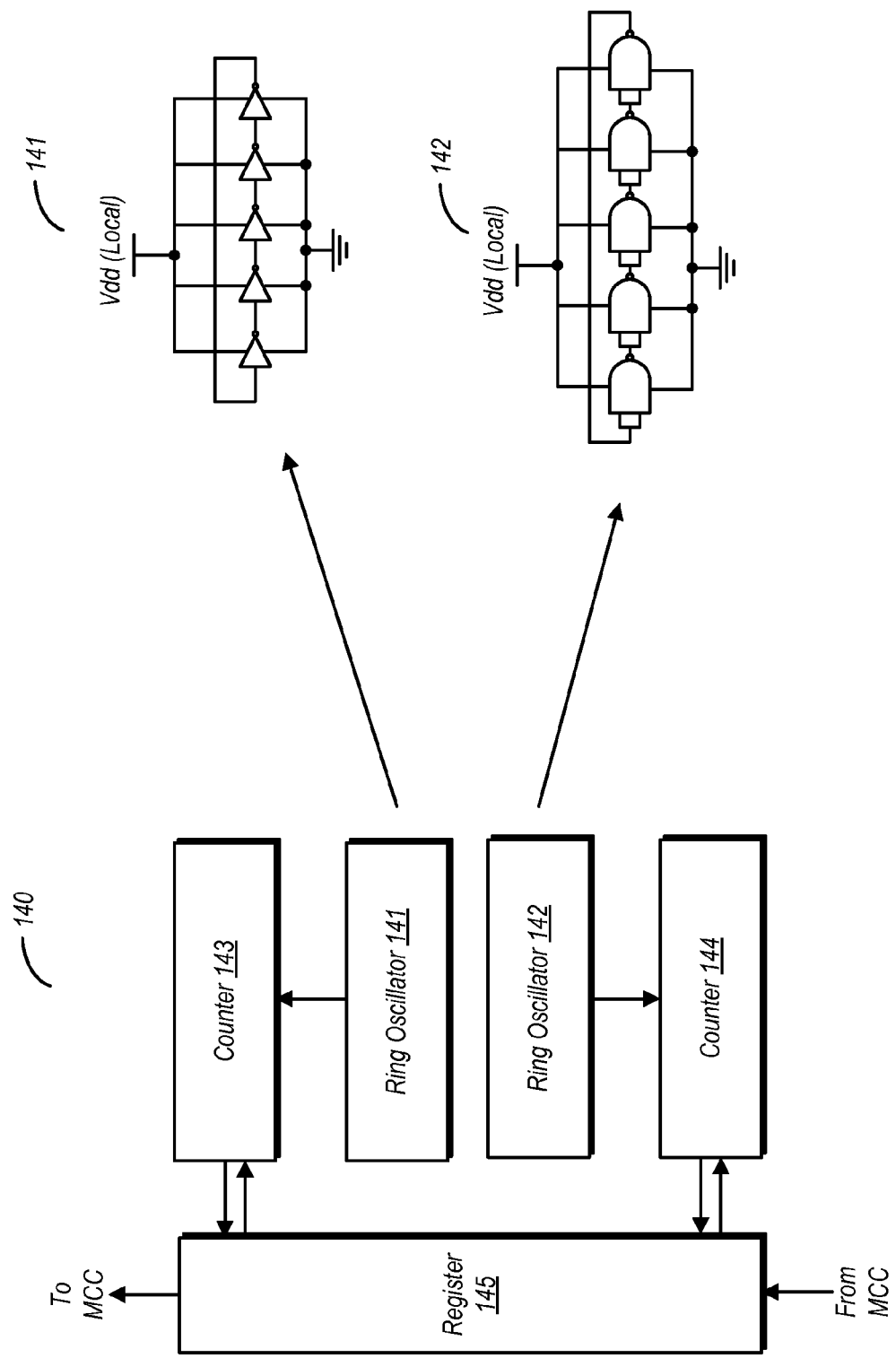
FIG. 4 is a block diagram of one embodiment of a sensor having two ring oscillators.

FIG. 4 is a diagram illustrating one embodiment of a sensor utilizing two ring oscillators. In the embodiment shown, sensor 140 includes ring oscillators 141 and 142, which may have different characteristics with respect to one another. In this particular embodiment, ring oscillator 141 is implemented using series-coupled inverters, while ring oscillator 142 is implemented using series-coupled NAND gates. Both of ring oscillators 141 and 142 are coupled to receive the same supply voltage, Vdd (Local), and are placed in close proximity to one another. However, due to the different circuit implementations, ring oscillators 141 and 142 may oscillate at different frequencies in identical operating conditions. In accordance with the discussion above, this may enable the respective frequencies produced by ring oscillators 141 and 142 to be the basis for solving for voltage and temperature at sensor 140.

Ring oscillators 141 and 142 are coupled to counters 143 and 144, respectively. These counters may be coupled to one or more tap points in their respectively coupled ring oscillators. During the taking of a measurement, counters 143 and 144 may track one or more count values that may in turn indicate the frequencies produced by ring oscillators 141 and 142, respectively. In some embodiments, each of counters 143 and 144 may include respective timer that track a run time for allowing counters to accumulate a count during a measurement. Other embodiments are possible and contemplated in which a separate timer coupled to both counters is provided.

Counters 143 and 144 are each coupled to register 144. Using register 144, MCC 105 (of FIG. 1) may input information into the counters, and may also receive information therefrom. For example, information indicative of a run time for a counter to track a count value produced by the oscillation of a correspondingly coupled ring oscillator may be input into the counters, from MCC 105, via register 145. A start indication may also be input through register 145. From counters 143 and 144, register 145 may receive the count values produced during an actual measurement. In accordance with the embodiment shown in FIG. 1, these values may be serially shifted through metrology bus 13 to MCC 105 for use in computing the voltage and temperature values. Embodiments in which register 145 is directly coupled to an implementation of MCC 105 are also possible and contemplated.

Figure 5:
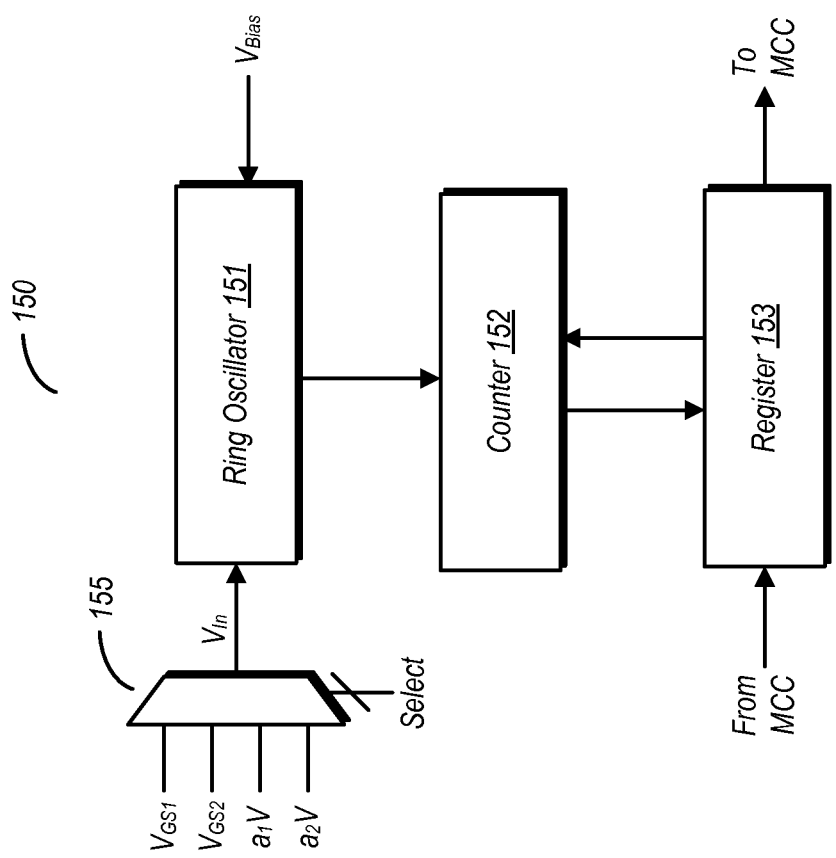
FIG. 5 is a block diagram of one embodiment of a sensor having a single ring oscillator.

FIG. 5 is a diagram illustrating one embodiment of a sensor utilizing a single ring oscillator. Using this type of sensor, voltage and temperature may be determined using a multi-sensing technique in which measurements are taken using a single ring oscillator with measurements performed at different input voltages. Ring oscillator 151 in this particular embodiment is coupled to receive a bias voltage, $V_{Bias}$, and a selectable input voltage, $V_{in}$. The bias voltage may be generated by any suitable circuitry for generating such a voltage, and may be substantially the same for all measurements. The circuitry for generating the bias voltage may be local to the sensor, or may be generated globally and distributed to each of the sensors. The input voltage, $V_{in}$, may be any one of the voltage input through selection circuit 155. Generation of these voltages for one embodiment is further described below in reference to FIG. 6. Control of the selection signal for selecting these voltages may be performed by MCC 105.

Ring oscillator 151 in the embodiment shown is coupled to counter 152 via one or more tap points, and may cause the counter to toggle when operating. Counter 152 may thus track the count value, and at the end of a predetermined period, may discontinue counting and provide the count value to register 153. The count value may then be forwarded to MCC 105 for voltage and temperature computation. Similarly, counter 152 may receive information from MCC 105, via register 153, in a manner similar to that described above with reference to the embodiment of FIG. 4.

Ring oscillator 151 may be characterized by a polynomial in a manner similar to that described above with reference to FIG. 3. The technique may involve a surface fitting technique for multiple frequency measurements at multiple voltages and frequencies. That is, the frequency response of ring oscillator 151, in terms of voltage and temperature, can be characterized per equations (1) and (4) above.

To perform voltage and temperature measurements, frequency measurements may be made at the four different input voltages provided through selector 155. The following frequency measurements may be made:

$$\text{for } V_{in} = V_{GS1}, f_1 = f_0 + K_{VCO}(V_{GS1} - V_0) \quad (23),$$

$$\text{for } V_{in} = V_{GS2}, f_2 = f_0 + K_{VCO}(V_{GS2} - V_0) \quad (24),$$

$$\text{for } V_{in} = a_1 V, f_3 = f_0 + K_{VCO}(a_1 V - V_0) \quad (25), \text{ and}$$

$$\text{for } V_{in} = a_2 V, f_4 = f_0 + K_{VCO}(a_2 V - V_0) \quad (26).$$

The above set of equations assume that $a_1 V$ and $a_2 V$ are chosen to be close to $V_{GS1}$ and $V_{GS2}$ so that the same linearized model of the ring oscillator (i.e. $K_{VCO}$, $V_0$, and $f_0$) can be used for all of them.

From the above measurement, the following equation may be deduced:

$$(f_4 - f_3)/(f_2 - f_1) = (a_2 - a_1) V / (V_{GS1} - V_{GS2}) \quad (27).$$

In the subthreshold region $V_T \ln N$, and $V_T$ can be rewritten as $kT/q$. Accordingly, equation 25 can be rewritten as $$(f_4-f_3)/(f_2-f_1)=(a_2-a_1)V/(kT/q)\ln N \qquad (28).$$

From this, the ring oscillator characterization can be reduced to:

$$f_{RO}=\Sigma \beta_{ij}T^i V^j \qquad (29).$$

Using equation 27, temperature T can be solved for and plugged back into the polynomial characterization to solve for voltage V.

For calibration using ATE, frequencies may be determined at two temperatures and two supply voltages. Linear interpolation may be used for other measured frequencies. Additional frequency measurements may improve the surface fit. During operation, additional measurements may be taken, with the results used to replace interpolated values until a desired number have been replaced. This in turn may improve the accuracy of measurements taken during normal operation.

Figure 6:
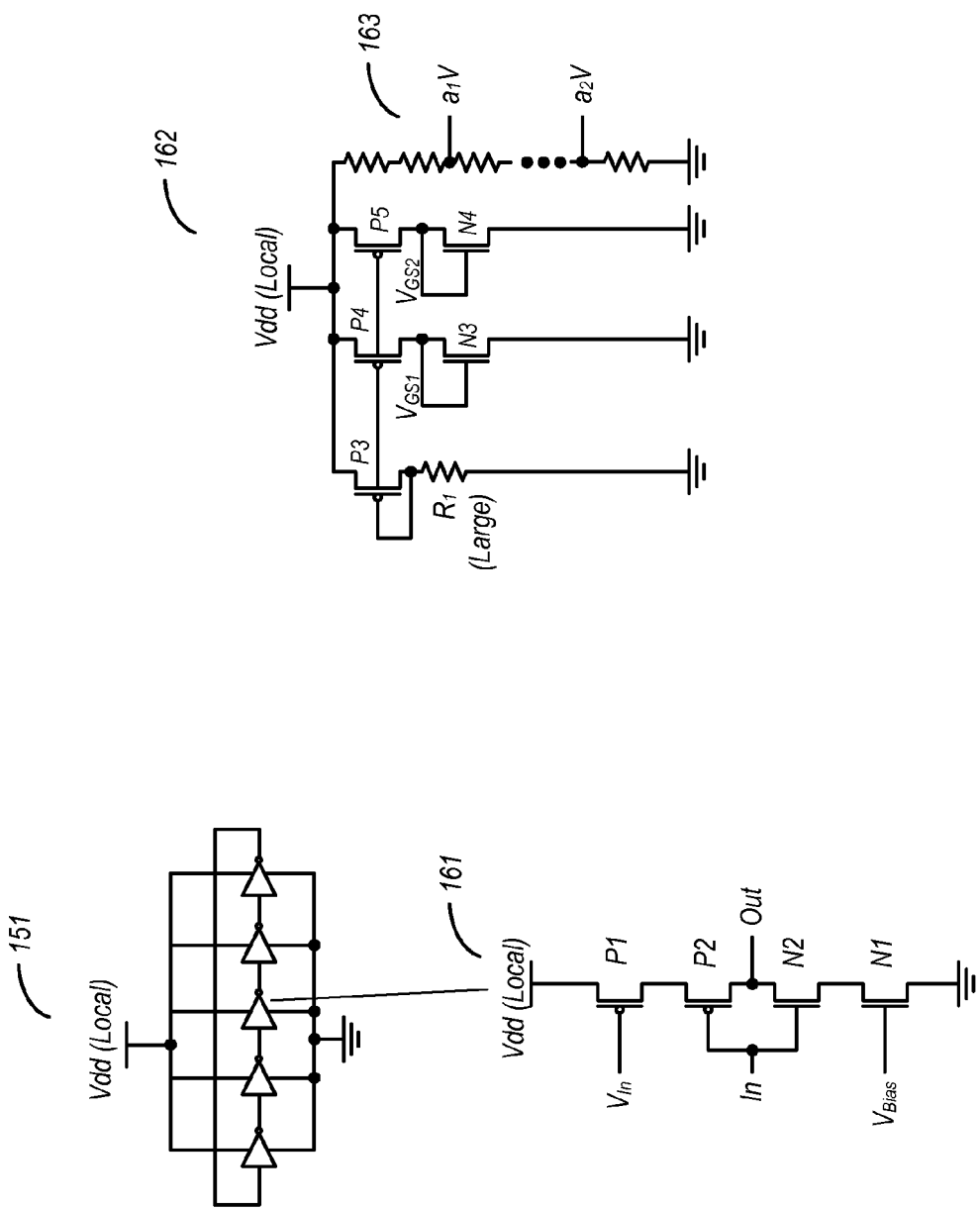
FIG. 6 is a schematic diagram of one embodiment of circuitry used in implementing a ring oscillator.

FIG. 6 includes schematic diagrams of circuit elements used in and with a sensor 150. In the embodiment shown, ring oscillator 151 includes a number of serially-coupled inverters 161. Each inverter 161 includes a stack of two PMOS (p-channel metal oxide semiconductor) and two NMOS (n-channel metal oxide semiconductor) transistors. The PMOS stack includes P1 and P2, while the NMOS stack includes N1 and N2. During operation, the gate terminal of P1 receives one of the input voltages discussed above in reference to FIG. 5. Similarly, N1 receives the bias voltage $V_{Bias}$ on its respective gate terminal. P2 and N2 each have respective gate terminals coupled to the input node and respective drain terminals coupled to the output node. Accordingly, P2 and N2 operate to perform the actual inverter functions. N1 operates to set characteristics of the inverter, while P1 operates, via the different values of $V_{in}$, to vary the characteristics of the inverter. Each inverter 161 of ring oscillator 151 may be configured in this manner. In varying the input voltage provided to P1 of each of the inverters 161, the characteristics of and thus frequency output by ring oscillator 151 may be varied. This in turn may allow for calibrations and measurements to be performed to determine the temperature and voltage (i.e. the supply voltage) detected by each sensor.

Reference circuit 162 in the embodiment shown is configured to generate the various voltages that may be provided as $V_{in}$ to P1 of each inverter 161. The circuit includes PMOS transistors P3, P4, and P5, and NMOS transistors N3 and N4. Transistor P3 is coupled between Vdd (Local) and resistor R1, which has a relatively large resistance value. This resistor sets the gate voltage for P3, P4, and P5. Voltages $V_{GS1}$ and $V_{GS2}$ are taken from the drain terminals of P4 and P5, respectively. The relative sizing of P4 to P5 is 1:N, and thus voltages $V_{GS1}$ and $V_{GS2}$ are different (this is also the source of the 'N' term in equation 26). Using a large resistance value for R1 ensures that the current flowing through N3 and N4 is very small and thus devices operate in subthreshold region. This guarantees that the difference between $V_{GS1}$ and $V_{GS2}$ is a proportional to absolute temperature (PTAT) voltage. The other two voltages, $a_1V$ and $a_2V$, are produced from tap points on resistor ladder 163.

Reference circuit 162 may be implemented in various ways. In one embodiment, each sensor may include a reference circuit 162 dedicated thereto. In another embodiment, each functional circuit block may have a reference circuit 162 that provides these voltages to the ring oscillator 151 of each sensor. In yet another embodiment, each different voltage supply (or voltage rail) may associated with on reference circuit 162, which distributes the various voltages to each ring oscillator 151 that receives it supply voltage from the same source.

Figure 7:
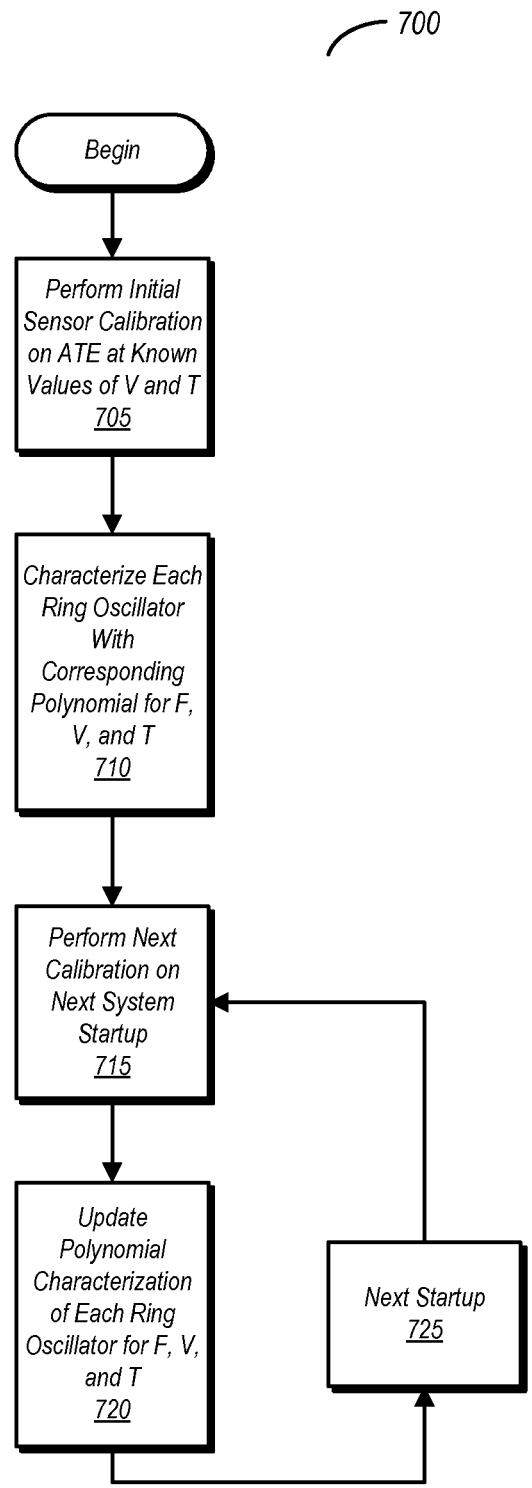
FIG. 7 is flow diagram of one embodiment of a method for calibrating sensors on an IC.

FIG. 7 is a flow diagram of one embodiment of a method for performing a calibration of a sensor or sensors in IC, wherein the sensors utilize ring oscillators. Method 700 may be performed using any of the various circuit embodiments discussed above, as well as with software and/or firmware associated therewith. Other hardware/software/firmware embodiments not explicitly discussed herein that are also capable of performing method 700 are possible and contemplated.

Method 700 begins with an initial sensor calibration performed on ATE using known values of V and T (block 705). In one embodiment, each ring oscillator may be calibrated using at least two different points of V and T. Interpolation between these points may be used in completing the initial characterization for each ring oscillator. Additional points may be used as well, if desired. The number of points used in each this portion of the calibration may vary based on desired accuracy, allowable time on ATE for each unit of the IC, available processing capability and available memory capability. In general, the greater the number of points used, the more accurate the initial calibration will be, although this typically results in greater time for each unit of the IC on ATE.

It is further noted that the calibrations performed herein may include performance of the various mathematical methodologies discussed above. However, other methodologies that include the characterization of a ring oscillator using a polynomial or other mathematical function are also possible and contemplated.

Based on the points used in the ATE calibration, each ring oscillator may be characterized with a polynomial that expresses the frequency of operation of the ring oscillator as a function of voltage and temperature (block 710). This polynomial may provide a starting point for subsequent calibrations, and may be update responsive thereto.

A next calibration may be performed on subsequent startup of the system that includes the IC upon which the sensors are implemented (block 715). Responsive to these subsequent calibrations, the polynomials characterizing each ring oscillator may be updated (block 720). At each subsequent next startup (block 725), the method may return to block 715, and another calibration is performed with another update of each polynomial corresponding to a calibrated ring oscillator.

The performance of calibrations is not limited to those instances discussed above. For example, calibrations may also be performed periodically during operation in one embodiment. In another embodiment, the V and T values detected by a sensor in MCC 105 (or equivalent circuit/unit) and a more accurate reference sensor may be monitored. If the values of V and T detected by the sensor (which is configured as those in the functional circuit blocks) and the reference sensor are different by more than a predetermined value, a calibration may be performed responsive thereto. In yet another embodiment, if the difference between the detected V and T values by the sensor and the reference sensor changes at a sudden rate, or more than a predetermined rate, a calibration may be performed. Accordingly, the methodology discussed herein may be construed to include such embodiments within its scope.

Figure 8:
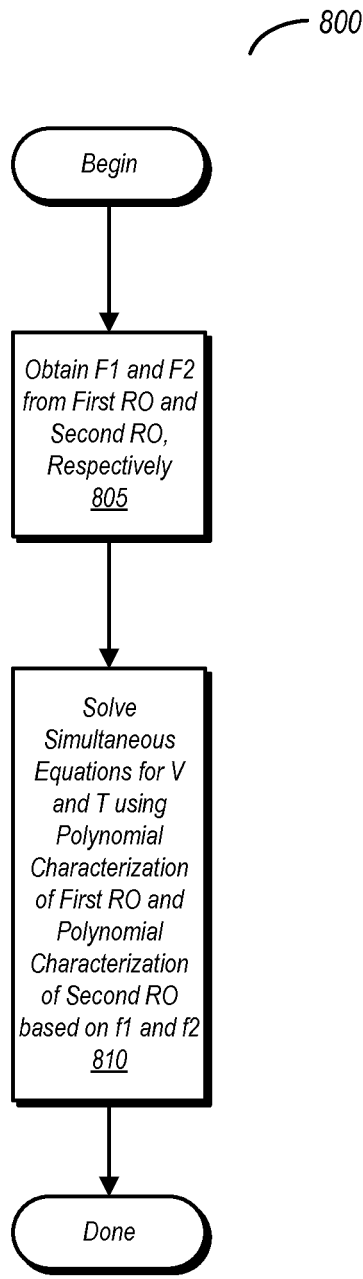
FIG. 8 is a flow diagram of one embodiment of a method for determining voltage and temperature indicated by a sensor using two ring oscillators.

FIG. 8 is a flow diagram of one embodiment of a method for determining voltage and temperature indicated by a sensor using two ring oscillators. The embodiment of method 800 discussed herein may be performed using any of the embodiments in which sensors utilize two ring oscillators having different characteristics. The configuration of the ring oscillators may include those explicitly discussed above, as well as those not explicitly discussed herein. The various mathematical methodologies discussed above may be used to characterize the ring oscillators employed in a particular embodiment. Additional mathematical methodologies not explicitly discussed herein may also be utilized within the scope of this disclosure.

Method 800 begins with the obtaining of frequency values f1 and f2 from first and second ring oscillators, respectively (block 805). These frequency values may be inserted into the polynomial expressions that characterize the respective ring oscillators from which they were produced. Since the ring oscillators may be placed in close proximity to one another and thus operate in substantially the same voltage and temperature conditions, the corresponding polynomials by which they are characterized can be considered simultaneous equations. Accordingly, the simultaneous equations can be solved for voltage and temperature based on the indicated values of f1 and f2 (block 810).

Figure 9:
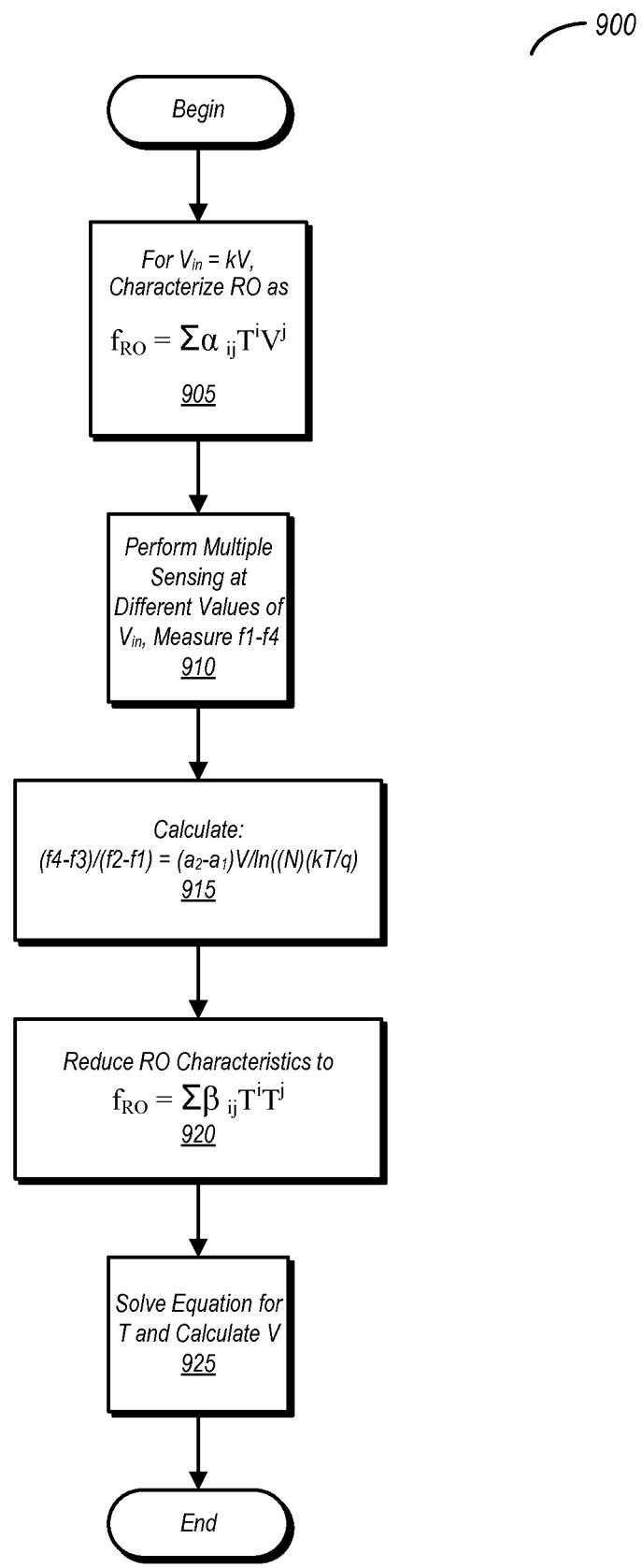
FIG. 9 is a flow diagram of one embodiment of a method for determining voltage and temperature indicated by a sensor using a single ring oscillator.

FIG. 9 is a flow diagram of one embodiment of a method for determining voltage and temperature indicated by a sensor using a single ring oscillator. Method 900 as discussed herein may be performed using various embodiment that include sensors having a single ring oscillator as discussed above. Other hardware embodiments, as well as supporting software and/or firmware embodiments not explicitly discussed herein are also contemplated as being capable for performing method 900, and thus fall within the scope of this disclosure.

Method 900 with characterizing a ring oscillator as a polynomial function in which the output frequency is a function of voltage and temperature (block 905). After characterization is performed, perform multiple sensing using different values of $V_{in}$, measuring frequencies f1-f4 (block 910). Using the frequency values determined, a calculation is made based on equation (26) discussed above (block 915). From this the ring oscillator characteristic may be reduced to equation 27 as discussed above, wherein one of the voltage terms is replaced with a temperature term (block 920). Having replaced one of the voltage terms with a temperature term, equation 27 may be solved for temperature T, and based thereon, the voltage V may be calculated (block 925).

Figure 10:
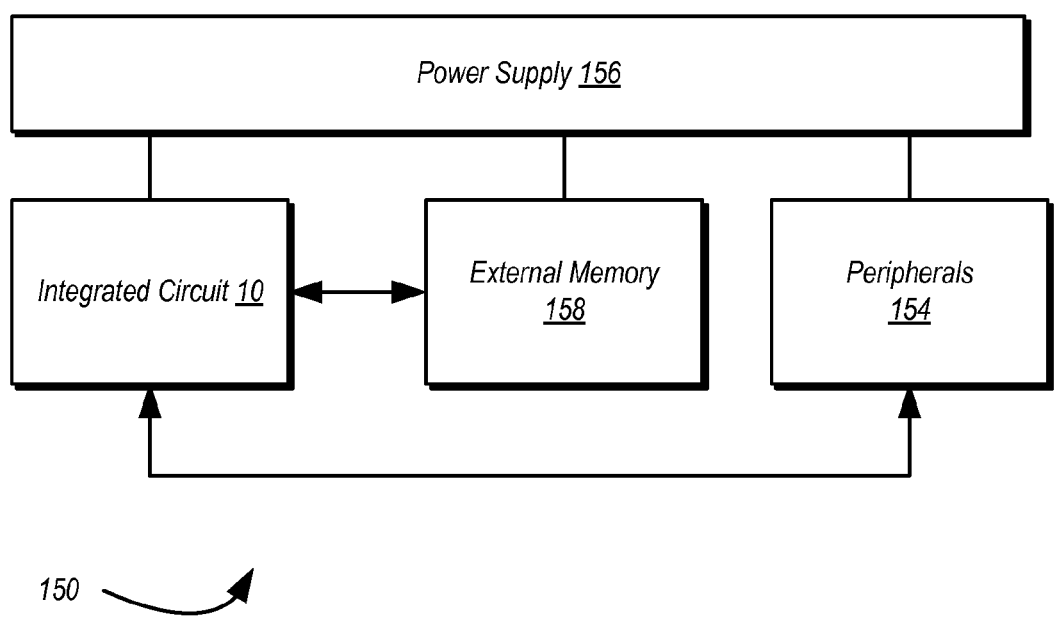
FIG. 10 is a block diagram of one embodiment of an exemplary system.

Turning next to FIG. 10, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   metrology control circuitry comprising a reference sensor;
   one or more local supply voltage nodes;
   a plurality of functional circuit blocks each including functional circuitry, wherein each of the plurality of functional circuit blocks is coupled to receive a corresponding local supply voltage from at least one of the one or more local supply voltage nodes; and
   a plurality of sensors coupled in series to the metrology control circuitry, wherein:
   the plurality of functional circuit blocks includes at least one of the plurality of sensors;
      each of the plurality of sensors is coupled to the same local supply voltage node of the functional circuit block in which it is included to receive the local supply voltage that is provided to the functional circuitry implemented in its corresponding one of the functional circuit blocks;
      each of the plurality of sensors is configured to measure and provide indications of a system parameter to the metrology control circuitry; and
      each of the sensors is calibrated by the metrology control circuitry using the reference sensor to compensate for process, voltage, and temperature dependencies.

2. The integrated circuit as recited in claim 1, wherein each of the plurality of sensors includes at least two ring oscillators each coupled to receive the local supply voltage provided to the functional circuitry implemented in its corresponding one of the functional circuit blocks, wherein the ring oscillators each have different characteristics with respect to one another.

3. The integrated circuit as recited in claim 2, wherein each of the ring oscillators in each of the plurality of sensors is calibrated to compensate for process, voltage, and temperature dependencies using a technique of surface fitting of characteristics of the ring oscillator.

4. The integrated circuit as recited in claim 2, wherein the ring oscillators in each of the plurality of sensors are calibrated to compensate for process, voltage, and temperature dependencies using a piecewise linear technique.

5. The integrated circuit as recited in claim 2, wherein at least one of the ring oscillators is implemented using a plurality of series-coupled NAND gates.

6. The integrated circuit as recited in claim 2, wherein at least one of the ring oscillators is implemented using a plurality of series-coupled inverters.

7. The integrated circuit as recited in claim 2, wherein each of the plurality of sensors further includes counting circuitry coupled to its respective ring oscillators.

8. The integrated circuit as recited in claim 2, wherein each of the ring oscillators of each of the plurality of sensors is characterized by a polynomial, wherein during operation of the integrated circuit, a voltage and a temperature determined by a given one of the plurality of sensors is determined by solving for voltage and temperature using respective frequencies read from each of the ring oscillators and the polynomial characterizing each of the ring oscillators.

9. The integrated circuit as recited in claim 1, wherein each of the plurality of sensors includes a ring oscillator coupled to receive the local supply voltage provided to the functional circuitry implemented in its corresponding one of the functional circuit blocks, wherein the ring oscillator is implemented using a plurality of series-coupled inverters.

10. The integrated circuit as recited in claim 9, wherein each of the series-coupled inverters include first and second transistors each having respective gate terminals coupled to an inverter input and respective drain terminals coupled to an inverter output, wherein each of the series-coupled inverters includes a third transistor coupled between the first transistor and a local voltage supply node, and a fourth transistor coupled between the second transistor and a reference node.

11. The integrated circuit as recited in claim 10, wherein the third transistor includes a respective gate terminal coupled to receive a variable input voltage, and wherein the fourth transistor includes a respective gate terminal coupled to receive a variable bias voltage.

12. The integrated circuit as recited in claim 1, wherein each of the plurality of sensors is coupled to a control circuit, and wherein the control circuit is configured to cause performance of a calibration of each of the plurality of sensors using a recursive least squares algorithm of a corresponding calibration polynomial.

13. The integrated circuit as recited in claim 1, further comprising a temperature sensor separate from the plurality of sensors, wherein the temperature sensor is coupled to receive an analog supply voltage separate from the local supply voltages provided to each of the plurality of functional circuit blocks.

14. The integrated circuit as recited in claim 1, wherein the integrated circuit is a system on a chip having at least one processing unit.

15. The integrated circuit as recited in claim 1, wherein each of the plurality of sensors is configured to provide an indication at least one of the following:
a temperature; and
a voltage.

16. A method comprising:
calibrating a plurality of sensors implemented in an integrated circuit, the plurality of sensors being coupled in series to a metrology control circuit having a reference sensor, wherein the integrated circuit includes a plurality of functional circuit blocks, and wherein one or more of the plurality of sensors is implemented in each of the plurality of circuit blocks, and wherein each of the plurality of sensors is coupled to a same local supply voltage node of the functional circuit block in which it is included to receive a local supply voltage that is also received by functional circuitry in its corresponding one of the functional circuit blocks, and wherein calibrating each of the plurality of sensors comprises the metrology control circuit using the reference sensor to compensate for process, voltage, and temperature dependencies; and
providing, based on measurements performed by each of the plurality of sensors, indications of one or more system parameters to the metrology control circuit.

17. The method as recited in claim 16, wherein each of the plurality of sensors includes a first ring oscillator and a second ring oscillator each coupled to receive the local supply voltage received by the functional circuitry in its corresponding one of the plurality of functional circuit blocks, and wherein the method further comprises characterizing each of the first and second ring oscillators with a respective, unique polynomial.

18. The method as recited in claim 17, further comprising:
initially characterizing each of the first and second ring oscillators by a unique polynomial indicating a respective output frequency that is a function of voltage and temperature;
mapping values of frequency, voltage, and temperature for each of the first and second ring oscillators to a surface;
performing measurements of a frequency output by each of the first and second ring oscillators for a plurality of voltage and temperature values; and
updating the unique polynomial for each of the first and second ring oscillators using a surface fitting technique.

19. The method as recited in claim 17, further comprising calibrating each of the first and second ring oscillators using a piecewise linear technique.

20. The method as recited in claim 17, wherein at least one of the first and second ring oscillators is implemented using a plurality of series-coupled NAND gates.

21. The method as recited in claim 17, wherein at least one of the first and second ring oscillators is implemented using a plurality of series-coupled inverters.

22. The method as recited in claim 17, further comprising:
the first ring oscillator toggling a first counter;
the second ring oscillator toggling a second counter; and
determining output frequencies of the first and second ring oscillator based on respective counts produced by the first and second ring oscillators.

23. The method as recited in claim 22, further comprising:
determining a voltage and a temperature indicated by the sensor by solving for voltage and temperature using the respective polynomials characterizing the first and second ring oscillators and respective frequencies indicated by the first and second counters.

24. The method as recited in claim 16, wherein each of the sensors includes a ring oscillator having a plurality of series-coupled inverters, wherein the ring oscillator is coupled to receive the local supply voltage provided to the functional circuitry implemented in its corresponding one of the plurality of functional circuit blocks, and wherein the method further comprises determining a voltage and a temperature based on a frequency of a signal produced by the ring oscillator.

25. The method as recited in claim 24, wherein each of the series-coupled inverters include first and second transistors each having respective gate terminals coupled to an inverter input and respective drain terminals coupled to an inverter output, wherein each of the series-coupled inverters includes a third transistor coupled between the first transistor and a local voltage supply node, and a fourth transistor coupled between the second transistor and a reference node.

26. The method as recited in claim 25, wherein calibrating the ring oscillator comprises providing a variable input voltage to a respective gate terminal of the third transistor and a variable bias voltage to a respective input of the fourth transistor.

27. The method as recited in claim 16, further comprising a control circuit calibrating the plurality of sensors using a recursive least squares algorithm.

28. The method as recited in claim 16, wherein the functional circuit blocks of the integrated circuit include one or more processor cores and a graphics processing unit, and wherein the method further comprises:
- determining a current voltage and temperature of one of the one or more processor cores using one or more of the plurality of sensors implemented therein; and
- determining a current voltage and temperature of the graphic processing unit using one or more of plurality of sensors implemented therein.

29. The method as recited in claim 16, further comprising:
- performing an initial calibration of each of the plurality of sensors during testing of the integrated circuit on automated test equipment (ATE);
- performing subsequent calibrations of each of the plurality of sensors during operation of the integrated circuit.

30. An apparatus comprising:
- metrology control circuitry comprising a reference sensor;
- one or more functional circuit blocks each including functional circuitry coupled to receive a respective local supply voltage; and
- a plurality of sensors coupled in series to the metrology control circuitry, wherein:
  - each of the one or more functional circuit blocks includes one or more of the plurality of sensors;
  - each of the sensors includes one or more ring oscillators each coupled to the same respective local supply voltage node of the functional circuit block in which it is included to receive the local supply voltage that is provided to the functional circuitry implemented in its corresponding functional circuit block;
  - each of the plurality of sensors is configured to determine a local voltage and a local temperature based on a frequency of oscillation of its corresponding ring oscillator and provide the local voltage and the local temperature to the metrology control circuitry; and
  - each ring oscillator of each of the plurality of sensors is calibrated by the metrology control circuitry using the reference sensor to compensate for process, voltage and temperature dependencies.

31. The apparatus as recited in claim 30, wherein each of the plurality of sensors includes a first ring oscillator characterized by a first polynomial, and a second ring oscillator characterized by a second polynomial.

32. The apparatus as recited in claim 31, wherein the first ring oscillator is implemented using a plurality of series-coupled inverters, and wherein the second ring oscillator is implemented using a plurality of series-coupled NAND gates.

33. The apparatus as recited in claim 31, wherein the first and second ring oscillators are calibrated using a surface fitting technique.

34. The apparatus as recited in claim 31, wherein the first and second ring oscillators are calibrated using a piecewise linear technique.

35. The apparatus as recited in claim 31, wherein the first and second ring oscillators are coupled to a control circuit configured to determine voltage and temperature sensed by the corresponding one of the plurality of sensors by solving for voltage and temperature based on frequency information generated by the first and second ring oscillators.

36. The apparatus as recited in claim 35, wherein each of the plurality of sensors includes a first counter coupled to its corresponding first ring oscillator and a second counter coupled to its corresponding second ring oscillator, wherein the control circuit is configured to determine a frequency output by each of the first and second oscillators based on count values received from the first and second counters, respectively.

37. The apparatus as recited in claim 30, wherein each of the plurality of sensors includes a single ring oscillator coupled to receive the local supply voltage provided to the functional circuitry implemented in its corresponding one of the functional circuit blocks.

38. The apparatus as recited in claim 37, wherein the ring oscillator is implemented using a plurality of series-coupled inverters each of which includes first and second transistors having respective gate terminals coupled to an inverter input and respective drain terminals coupled to an inverter output, wherein each of the series-coupled inverters includes a third transistor coupled between the first transistor and a local voltage supply node, and a fourth transistor coupled between the second transistor and a reference node.

39. The apparatus as recited in claim 38, wherein the third transistor includes a respective gate terminal coupled to receive a variable input voltage, and wherein the fourth transistor includes a respective gate terminal coupled to receive a variable bias voltage.

40. The apparatus as recited in claim 30, wherein each of the one or more functional circuit blocks is implemented on a single integrated circuit, and wherein each of the one or more functional circuit blocks includes at least one processing unit.

* * * * *